United States Patent [19]
Nataraj et al.

[11] Patent Number: 6,154,384
[45] Date of Patent: Nov. 28, 2000

[54] TERNARY CONTENT ADDRESSABLE MEMORY CELL

[75] Inventors: Bindiganavale S. Nataraj, Cupertino; Sandeep Khanna, Santa Clara; Varadarajan Srinivasan, Los Altos Hills, all of Calif.

[73] Assignee: NetLogic Microsystems, Inc., Mountain View, Calif.

[21] Appl. No.: 09/439,317

[22] Filed: Nov. 12, 1999

[51] Int. Cl.[7] .................................................. G11C 15/00
[52] U.S. Cl. .............................................. 365/49; 365/168
[58] Field of Search ....................... 365/49, 168, 189.01, 365/230.01

[56] References Cited

U.S. PATENT DOCUMENTS

| | | |
|---|---|---|
| 5,226,005 | 7/1993 | Lee et al. . |
| 5,319,590 | 6/1994 | Montoye . |
| 5,396,449 | 3/1995 | Atallah et al. . |
| 5,446,685 | 8/1995 | Holst . |
| 5,517,441 | 5/1996 | Dietz et al. . |
| 5,598,115 | 1/1997 | Holst . |
| 5,642,114 | 6/1997 | Komoto et al. . |
| 5,646,878 | 7/1997 | Samra . |
| 5,699,288 | 12/1997 | Kim et al. . |
| 5,870,324 | 2/1999 | Helwig et al. . |
| 5,940,852 | 8/1999 | Rangasayee et al. . |
| 5,949,696 | 9/1999 | Threewitt . |
| 5,993,363 | 8/1999 | Shindo . |
| 6,044,005 | 3/2000 | Gibson et al. ............................ 365/49 |

OTHER PUBLICATIONS

Japanese Patent Abstract, Publication No. 04021997 A, published Jan. 24, 1992, 1 page.
Japanese Patent Abstract, Publication No. 05182472 A, published Jul. 23, 1993, 1 page.
Chae, Soo–Ik, et al., "Content–Addressable Memory for VLSI Pattern Inspection", IEEE Journal Of Solid–State Circuits, vol. 23, No. 1, Feb. 1988, pp. 74–78.
MOSAID, The Next Generation of Content Addressable Memories, MOSAID Technologies Incorporated, Sep. 1999, 8 pages.

*Primary Examiner*—Terrell W. Fears
*Attorney, Agent, or Firm*—Blakely, Sokoloff, Taylor & Zafman

[57] ABSTRACT

A ternary content addressable memory (CAM) cell. For one embodiment, the ternary CAM cell includes a first memory cell, a compare circuit, a second memory cell and a mask circuit. The first memory cell is coupled to a first pair of bit lines that carries data to and from the first memory cell. The compare circuit receives comparand data on a pair of compare signal lines, and compares the comparand data with the data stored in the first memory cell. The compare circuit includes a pair of transistors and a match transistor. The pair of transistors receives the comparand data on the compare signal lines and also receives the data stored in the first memory cell. The match transistor determines the state of a match line. The second memory cell stores mask data that may mask the comparison result such that it does not affect the logical state of the match line.

19 Claims, 2 Drawing Sheets

TERNARY CONTENT ADDRESSABLE MEMORY CELL

FIELD OF THE INVENTION

The present invention relates generally to content addressable memory (CAM) cells.

BACKGROUND

A content addressable memory (CAM) device is a storage device that can be instructed to compare a specific pattern of comparand data with data stored in its associative CAM array. The entire CAM array, or segments thereof, are searched in parallel for a match with the comparand data. If a match exists, the CAM device indicates the match by asserting a match flag. Multiple matches may also be indicated by asserting a multiple match flag. The CAM device typically includes a priority encoder to translate the highest priority matching location into a match address or CAM index.

The generally fast parallel search capabilities of CAMs have proven useful in many applications including address filtering and lookups in routers and networking equipment, policy enforcement in policy-based routers, pattern recognition for encryption/decryption and compression/decompression applications, and other pattern recognition applications.

Binary CAM cells are able to store two states of information: a logic one state and a logic zero state. Binary CAM cells typically include a RAM cell and a compare circuit. The compare circuit compares the comparand data with data stored in the RAM cell and drives a match line to a predetermined state when there is a match. Columns of binary CAM cells may be globally masked by mask data stored in one or more global mask registers. Ternary CAM cells are mask-per-bit CAM cells that effectively store three states of information, namely: a logic one state, a logic zero state, and a don't care state for compare operations. Ternary CAM cells typically include a second RAM cell that stores local mask data for the each ternary CAM cell. The local mask data masks the comparison result of the comparand data with the data stored in the first RAM cell such that the comparison result does not affect the match line. The ternary CAM cell offers more flexibility to the user to determine on an entry-per-entry basis which bits in a word will be masked during a compare operation.

SUMMARY OF THE INVENTION

A ternary content addressable memory (CAM) cell is disclosed. For one embodiment, the ternary CAM cell includes a first memory cell, a compare circuit, a second memory cell and a mask circuit. The first memory cell is coupled to a first pair of bit lines that carries data to and from the first memory cell. The compare circuit receives comparand data on a pair of compare signal lines, and compares the comparand data with the data stored in the first memory cell. The compare circuit includes a pair of transistors and a match transistor. The pair of transistors receives the comparand data on the compare signal lines and also receives the data stored in the first memory cell. The match transistor determines the state of a match line. The second memory cell stores mask data that may mask the comparison result such that it does not affect the logical state of the match line.

Other objects, features, and advantages of the present invention will be apparent from the accompanying drawings and from the detailed description that follows below.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

In the following description, for purposes of explanation, specific nomenclature is set forth to provide a thorough understanding of the present invention. However, it will be apparent to one skilled in the art that these specific details may not be required to practice the present invention. In other instances, well known circuits and devices are shown in block diagram form to avoid obscuring the present invention unnecessarily. Additionally, the interconnection between circuit elements or blocks may be shown as buses or as single signal lines. Each of the buses may alternatively be single signal lines, and each of the single signal lines may alternatively be buses. Additionally, the prefix symbol "/" or the suffix "B" attached to signal names indicates that the signal is an active low signal. Each of the active low signals may be changed to active high signals as generally known in the art.

A ternary content addressable memory (CAM) cell is disclosed. For one embodiment, the ternary CAM cell includes a main memory cell, a compare circuit, a mask memory cell and a mask circuit. The main memory cell is coupled to a first pair of bit lines that carries data to and from the main memory cell. The compare circuit receives comparand data on a pair of compare signal lines, and compares the comparand data with the data stored in the main memory cell. The compare circuit includes a pair of transistors and a match transistor. The pair of transistors receives the comparand data on the compare signal lines and also receives the data stored in the main memory cell. The match transistor determines the state of a match line. The mask memory cell stores mask data that may mask the comparison result such that it does not affect the logical state of the match line.

The ternary CAM cell of the present invention decouples the read/write accesses to the main memory cell from compare operations. Comparand data is provided on compare signal lines while read and write data is carried on traditional data bit lines. By separating the compare signal lines from the data bit lines, a fewer number of transistors is coupled to each of the compare signal lines and the data bit lines than if a single set of signal lines carried both comparand data and read/write data. This increases the speed of the compare operation and the speed of read/write operations. Since the compare signal lines and data bit lines have reduced capacitance, this can also decrease the power drawn by the ternary CAM cell over other ternary CAM cells that share the same set of signal lines.

Figure 1:
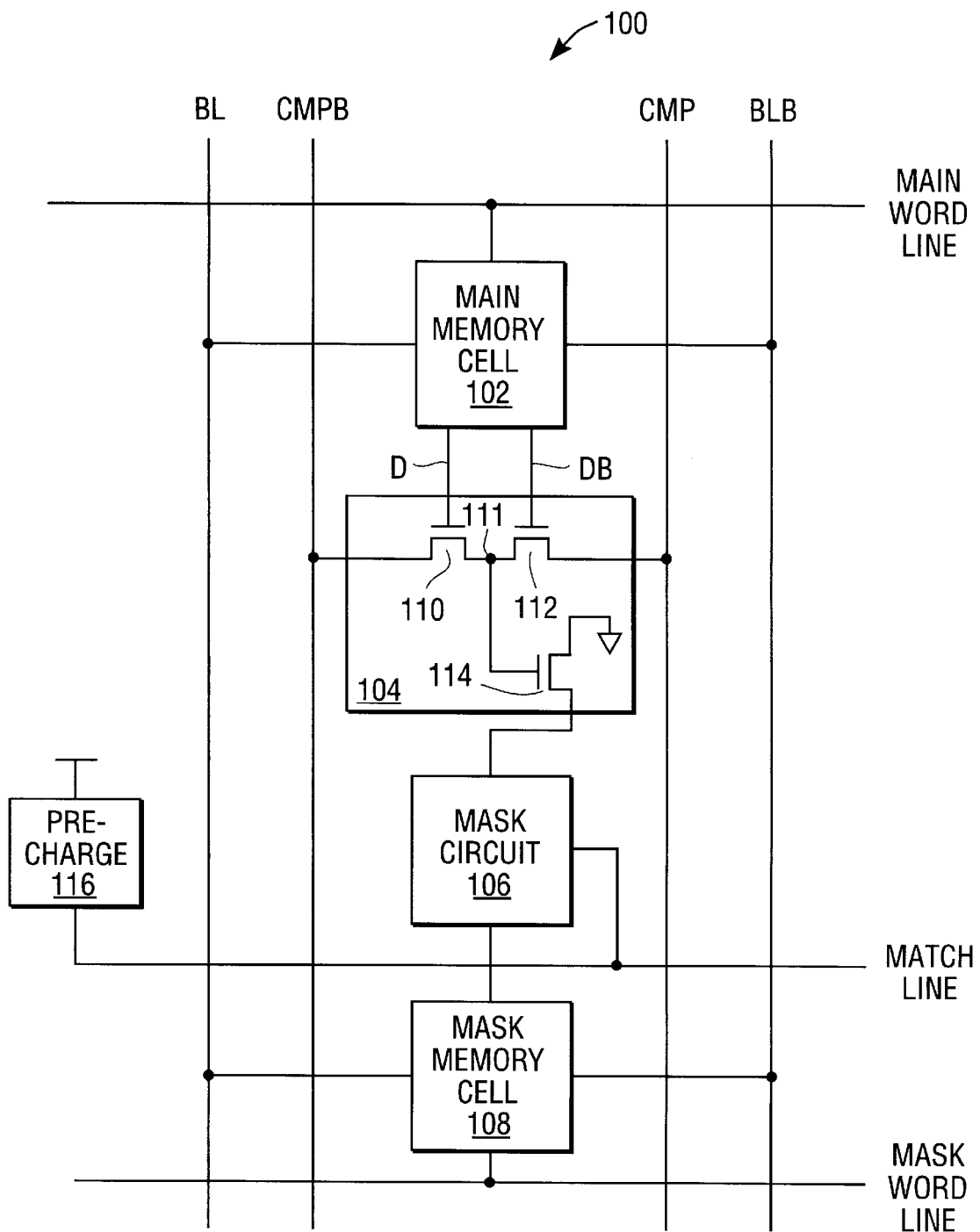
FIG. 1 is a block diagram of one embodiment of a ternary CAM cell.

FIG. 1 shows ternary CAM cell 100 that is one embodiment of a ternary CAM cell according to the present invention. Ternary CAM cell 100 includes main memory cell 102, compare circuit 104, mask circuit 106, and mask memory cell 108. Main memory cell 102 stores data to be compared with comparand data provided on compare signal lines CMP and CMPB. Main memory cell may be any type of memory storage element including a volatile or nonvolatile memory storage element. Data is written to and read from main memory cell 102 through data bit lines BL and BLB when the main word line is asserted to a predetermined logic state. For alternative embodiments, data may be read from or written to main memory cell 102 through only one of BL or BLB.

Mask memory cell 108 stores local mask data for ternary CAM cell 100. The local mask data indicates whether the comparison of the comparand data with the data stored in main memory cell 102 will be reflected on the match line. Mask memory cell 108 may be any type of memory storage element including a volatile or nonvolatile memory storage element. The local mask data may be written to or read from mask memory cell 108 through data bit lines BL and BLB when the mask word line is asserted to a predetermined logic state. For another embodiment, one word line may be shared by both main memory cell 102 and mask memory cell 108. The local mask data may also be read from or written to mask memory cell 108 through only one of BL or BLB. For still another embodiment, another set of data bit lines may be provided to separately provide local mask data to and from mask memory cell 108 independent of the data bit lines BL and BLB. This may further increase the speed of reading and writing data to main memory cell 102 and local mask data to mask memory cell 108 as the number of transistors coupled to each signal line, and thus the capacitance on each signal line, will be reduced. This may further reduce the power drawn by ternary CAM cell 100 during read and write operations.

Compare circuit 104 compares the data stored in main memory cell 102 with comparand data provided on compare signal lines CMP and CMPB. Compare circuit 104 includes transistors 110, 112, and 114 that perform the comparison function. Each of transistors 110, 112, and 114 are shown as NMOS transistors, however, they may also be implemented as PMOS transistors. Transistor 110 has its source coupled to CMPB, its drain coupled to node 111, and its gate coupled to main memory cell 102 to receive data (D) stored therein. Transistor 112 has its source coupled to CMP, its drain coupled to node 111, and its gate coupled to main memory cell 102 to receive complementary data (DB) stored therein. Transistor 114 is a match transistor that will pull the match line to a low logic state when the comparand data matches the data stored in main memory cell 102 so long as mask circuit 106 does not mask the comparison result. Note that transistors 110 and 112 are not connected directly to bit lines BL and BLB thereby reducing the capacitance on these signal lines over implementations in which the comparand data and the read/write data are provided over BL and BLB.

The local mask data stored in mask memory cell 108 is provided to mask circuit 106. Mask circuit 106 determines whether the compare result generated by compare circuit 104 will affect the logical state of the match line. When the local mask data indicates that the comparison should be masked, mask circuit 106 decouples or isolates compare circuit 104 from the match line such that the comparison results do not affect the match line. When the local mask data indicates that the comparison should not be masked, mask circuit 106 allows the comparison result generated by compare circuit 104 to affect the logic state of the match line.

The match line is initially pre-charged to a high logic state by pre-charge circuit 116. If there is unmasked match or a masked mismatch, the match line will remain pre-charged to a high logic state. If there is an unmasked mismatch, however, compare circuit 104 will discharge the match line to a low logic state. The match line of each row of ternary CAM cells may then be provided to a priority encoder that may determine the address, location or index of the highest priority matching entry in the CAM array.

Figure 2:
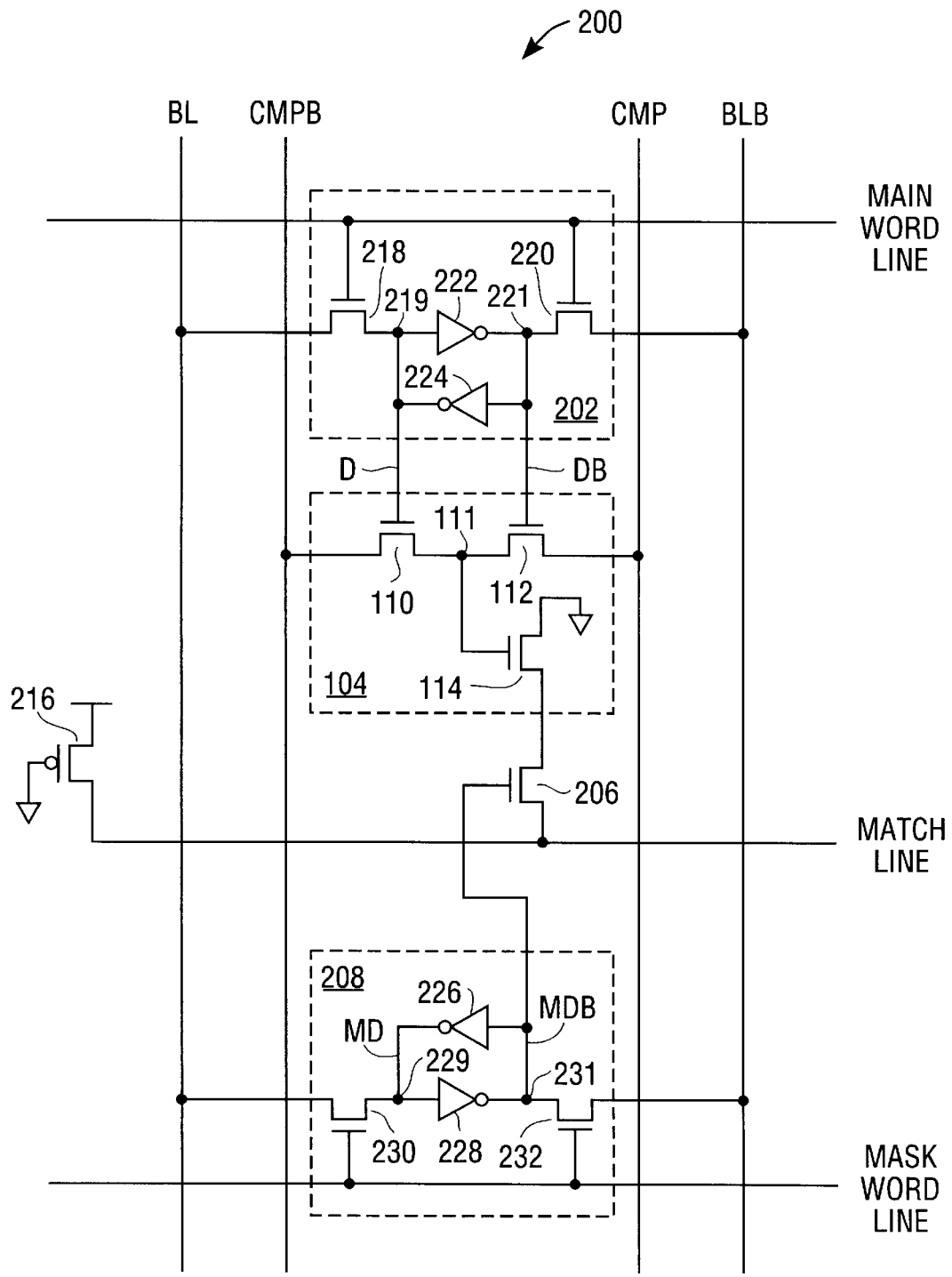
FIG. 2 is a circuit diagram of one embodiment of the ternary CAM cell of FIG. 1.

FIG. 2 shows ternary CAM cell 200 that is one embodiment of ternary CAM cell 100. Ternary CAM cell 200 includes main memory cell 202, mask circuit 206, mask memory cell 208 and pre-charge circuit 216 that are exemplary embodiments of main memory cell 102, mask circuit 106, mask memory cell 108, and pre-charge circuit 116, respectively. Many other embodiments may be used for each of these circuits.

Main memory cell 202 is a bi-stable memory circuit that includes two inverters 222 and 224 cross-coupled (output of one inverter coupled to the input of the other) between nodes 219 and 221. Inverters 222 and 224 may be any types of inverters including CMOS inverters, NMOS inverters, or the like. Node 219 stores D and node 221 stores DB. Main memory cell 202 also includes pass transistors 218 and 220 that communicate data on BL and BLB with nodes 219 and 221, respectively, in response to the logical state of the main word line. Node 219 is coupled to the gate of transistor 110, and node 221 is coupled to the gate of transistor 112.

Mask memory cell 208 is also a bi-stable memory circuit that includes two inverters 226 and 228 cross-coupled between nodes 229 and 231. Inverters 226 and 228 may be any types of inverters including CMOS inverters, NMOS inverters, or the like. Node 229 stores local mask data MD and node 221 stores the logical complement MDB. Mask memory cell 208 also includes pass transistors 230 and 232 that communicate local mask data on BL and BLB with nodes 229 and 231, respectively, in response to the logical state of the mask word line. Node 231 is coupled to the gate of mask transistor 206.

Mask transistor 206 is one embodiment of mask circuit 106. Mask transistor 206 has its drain coupled to the drain of match transistor 114, its gate coupled to node 229 of mask memory cell 208, and its source coupled to the match line. When the local mask data MDB is a low logic state (MD in a high logic state) indicating a mask condition, mask transistor 206 is off such that the compare results generated by compare circuit 104 do not affect the logical state of the match line. When, however, the local mask data MDB is in a high logic state (MD in a low logic state) indicating a non-mask condition, mask transistor 206 is on such that the compare results generated by compare circuit 104 affect the logical state of the match line. Note that transistor 206 is coupled in series with transistor 114 between the match line and ground. Any series arrangement may be used.

The truth table for the operation of ternary CAM cell 200 is shown in Table 1.

TABLE 1

| D | CMP | MDB | Match Line |
|---|-----|-----|------------|
| 0 | 0   | 0   | 1          |
| 0 | 0   | 1   | 1          |
| 0 | 1   | 0   | 1          |
| 0 | 1   | 1   | 0          |
| 1 | 0   | 0   | 1          |
| 1 | 0   | 1   | 0          |
| 1 | 1   | 0   | 1          |
| 1 | 1   | 1   | 1          |

The operation of ternary CAM cell 200 is as follows. Assume that main memory cell 208 stores a logic one state. Thus, node 219 stores a high logic state causing transistor 110 to be on, and node 221 stores a low logic state causing transistor 112 to be off. If the comparand data is also a logic one, then CMP will have a high logic state and CMPB will have a low logic state. Since transistor 110 is on, the low logic state on CMPB will be communicated to node 111 and turn transistor 114 off. When transistor 114 is off, the match line will remain pre-charged to a high logic state by PMOS transistor 216 to indicate a match. If, however, the comparand data is a logic zero, then CMPB will have a high logic state. Transistor 110 will transfer this high logic state to node 111 and cause transistor 114 to turn on. If the comparison is unmasked by the local mask data (MDB a high logic state), transistor 206 is also turned on and the match line is discharged to a low logic state indicating a mismatch condition. If, however, the comparison is masked by the local mask data (MDB a low logic state), transistor 206 is turned off and the match line remains pre-charged by transistor 216.

Now assume that main memory cell 208 stores a logic zero state. Thus, node 219 stores a low logic state causing transistor 110 to be off, and node 221 stores a high logic state causing transistor 112 to be on. If the comparand data is also a logic zero, then CMP will have a low logic state and CMPB will have a high logic state. Since transistor 112 is on, the low logic state on CMP will be communicated to node 111 and turn transistor 114 off. When transistor 114 is off, the match line will remain pre-charged to a high logic state by PMOS transistor 216 to indicate a match. If, however, the comparand data is a logic one, then CMP will have a high logic state. Transistor 112 will transfer this high logic state to node 111 and cause transistor 114 to turn on. If the comparison is unmasked by the local mask data (MDB a high logic state), transistor 206 is also turned on and the match line is discharged to a low logic state indicating a mismatch condition. If, however, the comparison is masked by the local mask data (MDB a low logic state), transistor 206 is turned off and the match line remains pre-charged by transistor 216.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A ternary content addressable memory (CAM) cell comprising:
    a first memory cell for storing data;
    a first pair of bit lines coupled to the first memory cell to carry the data to and from the first memory cell;
    a pair of compare signal lines for carrying comparand data;
    a match line;
    a second memory cell for storing mask data;
    a mask circuit coupled to the match line and the second memory cell to receive the mask data; and
    a compare circuit comprising:
        a pair of transistors coupled between the pair of compare signal lines and coupled to the first memory cell to receive the data; and
        a match transistor coupled to the pair of transistors and the mask circuit to receive the mask data.

2. The ternary CAM cell of claim 1, wherein the pair of transistors comprise:
    a first transistor having a first terminal coupled to a first one of the compare signal lines, a second terminal coupled to a node, and a third terminal coupled to receive the data from the first memory cell; and
    a second transistor having a first terminal coupled to a second one of the compare signal lines, a second terminal coupled to the node, and a third terminal coupled to receive the data from the first memory cell.

3. The ternary CAM cell of claim 1, further comprising a first word line coupled to the first memory cell.

4. The ternary CAM cell of claim 3, wherein the first word line is further coupled to the second memory cell.

5. The ternary CAM cell of claim 3, further comprising a second word line coupled to the second memory cell.

6. The ternary CAM cell of claim 1, further comprising a second pair of bit lines coupled to the second memory cell, the second pair of bit lines for carrying the mask data to and from the second memory cell.

7. The ternary CAM cell of claim 1, wherein the mask circuit comprises a mask transistor coupled in series with the match transistor between a power supply terminal and the match line.

8. A ternary content addressable memory (CAM) cell comprising:
    a first memory cell for storing data;
    a first pair of bit lines coupled to the first memory cell to carry the data to and from the first memory cell;
    a pair of compare signal lines for carrying comparand data;
    a second memory cell for storing mask data;
    means for comparing the data stored in the first memory cell with the mask data; and
    means for masking the comparison of the data stored in the first memory cell with the mask data.

9. A method of operating a ternary content addressable memory (CAM) cell comprising:
    writing data to a first memory cell over a first pair of bit lines;
    comparing comparand data provided over a pair of compare signal lines with the data written to the first memory cell to generate a comparison result; and
    masking the comparison result from affecting the logical state of a match line.

10. The method of claim 9, further comprising writing mask data to a second memory cell circuit to receive the mask data.

11. The method of claim 10, wherein writing the mask data comprises writing the mask data over a second pair of bit lines.

12. The method of claim 10, further comprising simultaneously writing the data to the first memory cell and the mask data to the second memory cell.

13. The ternary CAM cell of claim 10, further comprising simultaneously reading the data from the first memory cell and the mask data from the second memory cell.

14. A ternary content addressable memory (CAM) cell comprising:
    a first memory cell for storing data;
    a second memory cell for storing mask data;
    a match line;
    a mask circuit coupled to the coupled to the match line and the second memory cell to receive the mask data; and
    a compare circuit comprising:
        a pair of transistors coupled to receive comparand data from a pair of signal lines and coupled to the first memory cell to receive the data; and a match transistor coupled to the pair of transistors and the mask circuit to receive the mask data.

15. The ternary CAM cell of claim 14, wherein the pair of transistors comprise:
   a first transistor having a first terminal coupled to a first one of the pair of signal lines, a second terminal coupled to a node, and a third terminal coupled to receive the data from the first memory cell; and
   a second transistor having a first terminal coupled to a second one of the pair of signal lines, a second terminal coupled to the node, and a third terminal coupled to receive the data from the first memory cell.

16. The ternary CAM cell of claim 14, further comprising a first word line coupled to the first memory cell.

17. The ternary CAM cell of claim 16, wherein the first word line is further coupled to the second memory cell.

18. The ternary CAM cell of claim 16, further comprising a second word line coupled to the second memory cell.

19. The ternary CAM cell of claim 14, wherein the mask circuit comprises a mask transistor coupled in series with the match transistor between a power supply terminal and the match line.

* * * * *